United States Patent [19]

Kohno

[11] Patent Number: 5,301,144
[45] Date of Patent: Apr. 5, 1994

[54] SEMICONDUCTOR MEMORY DEVICE HAVING A DECODING CIRCUIT FOR REDUCING ELECTRIC FIELD STRESS APPLIED TO MEMORY CELLS

[75] Inventor: Takaki Kohno, Tokyo, Japan

[73] Assignee: NEC Corporation, Tokyo, Japan

[21] Appl. No.: 730,652

[22] Filed: Jul. 16, 1991

[30] Foreign Application Priority Data

Jul. 16, 1990 [JP] Japan .................. 2-188428

[51] Int. Cl.⁵ ............................................ G11C 17/00
[52] U.S. Cl. .................................. 365/104; 365/185; 365/230.06
[58] Field of Search ................... 365/185, 104, 230.06; 307/468, 465

[56] References Cited

U.S. PATENT DOCUMENTS

| | | | |
|---|---|---|---|
| 4,467,453 | 8/1984 | Chiu et al. | 365/185 |
| 4,489,400 | 12/1984 | Southerland, Jr. | 365/104 |
| 4,727,515 | 2/1988 | Hsu | 365/185 |
| 4,855,955 | 8/1989 | Cioaca | 365/185 |
| 4,888,735 | 12/1989 | Lee et al. | 365/189 |
| 4,959,812 | 9/1990 | Momodomi et al. | 365/185 |
| 4,996,669 | 2/1991 | Endon et al. | 365/185 |
| 5,008,856 | 4/1991 | Iwahashi | 365/185 |
| 5,021,689 | 6/1991 | Pickett et al. | 365/465 |
| 5,043,942 | 8/1991 | Iwata et al. | 365/185 |
| 5,075,890 | 12/1991 | Itoh et al. | 365/189.09 |
| 5,148,394 | 9/1992 | Iwahashi | 365/185 |

OTHER PUBLICATIONS

D'Arrigo et al, "Nonvolatile Memories", IEEE International Solid-State Circuits Conference, 1989, pp. 132–133.

"Low Power Decoding Scheme For Partitioned Arrays", IBM Technical Disclosure Bulletin, vol. 29, No. 4, 1986, pp. 1533–1535.

*Primary Examiner*—William L. Sikes
*Assistant Examiner*—Terry D. Cunningham
*Attorney, Agent, or Firm*—Leydig, Voit & Mayer

[57] ABSTRACT

Electric field stress applied to memory cells is relieved in a semiconductor memory device. For this purpose, an X-decoder circuit applies a low level signal to a selected memory cell in a selected memory cell block of a selected memory cell matrix, and a high level signal to non-selected memory cells in the selected memory cell block, while the X-decoder circuit applies the low level signal to memory cells of non-selected memory cell blocks of the selected memory cell matrix and memory cells of non-selected memory cell matrices.

6 Claims, 8 Drawing Sheets

FIG.5 PRIOR ART

| a1 | a2 | $C_e$ | $S_j$ | $W_{jk}$ |
|----|----|----|----|----|
| H | H | L | L | H |

FIG.6 PRIOR ART

| INPUT ADDRESS SIGNAL | | SELECTED WORD LINE |
|----|----|----|
| a3 | a4 | k = 1 |
| a3 | $\overline{a4}$ | k = 2 |
| $\overline{a3}$ | a4 | k = 3 |
| $\overline{a3}$ | $\overline{a4}$ | k = 4 |

FIG.7 PRIOR ART

| a1 | a2 | C0 | Sj j=1 | 2 | 3 | 4 | Wjk j=1 | 2 | 3 | 4 |
|---|---|---|---|---|---|---|---|---|---|---|
| L | L | H | H | L | L | L | W11=L W12~14=H | H | H | H |
| L | H | H | L | H | L | L | H | W21=L W22~24=H | H | H |
| H | L | H | L | L | H | L | H | H | W31=L W32~34=H | H |
| H | H | H | L | L | L | H | H | H | H | W41=L W42~44=H |

| a1 | a2 | Ce | Sj | Wjk |
|----|----|----|----|-----|
| H  | H  | L  | L  | L   |

| INPUT ADDRESS SIGNAL | | SELECTED WORD LINE |
|----|----|----|
| a3 | a4 | k = 1 |
| a3 | $\overline{a4}$ | k = 2 |
| $\overline{a3}$ | a4 | k = 3 |
| $\overline{a3}$ | $\overline{a4}$ | k = 4 |

FIG. 11

| a1 | a2 | Ce | \multicolumn{4}{c}{Sj} | \multicolumn{4}{c}{Wjk} |

| a1 | a2 | Ce | j=1 | 2 | 3 | 4 | j=1 | 2 | 3 | 4 |
|----|----|----|-----|---|---|---|-----|---|---|---|
| L  | L  | H  | H   | L | L | L | W11=L, W12~14=H | L | L | L |
| L  | H  | H  | L   | H | L | L | L | W21=L, W22~24=H | L | L |
| H  | L  | H  | L   | L | H | L | L | L | W31=L, W32~34=H | L |
| H  | H  | H  | L   | L | L | H | L | L | L | W41=L, W42~44=H |

SEMICONDUCTOR MEMORY DEVICE HAVING A DECODING CIRCUIT FOR REDUCING ELECTRIC FIELD STRESS APPLIED TO MEMORY CELLS

FIELD OF THE INVENTION

This invention relates to a semiconductor memory device, and more particularly to, a mask programmable read only memory in which electric field stress applied to memory cells is relieved.

BACKGROUND OF THE INVENTION

A conventional mask programmable read only memory comprises a plurality of memory cell matrices each having a plurality of memory cell blocks. Each of the memory cell blocks comprises a plurality of memory cells serially connected, and the serially connected memory cells are connected through a block selection transistor to a digit line on one side thereof, and are connected to ground on the other side thereof.

In this mask programmable read only memory, the memory cell unit is composed, for instance, in such a manner that N channel MOS enhancement transistor having a threshold voltage of 1.0 V and N channel MOS depletion transistor having a threshold voltage of $-5.0$ V are assigned to store binary signals in accordance with the difference of the threshold voltages which is resulted from the injection of impurity, for instance, P into the transistors.

In operation, one of the memory cell matrices is selected by a Y-decoder circuit, while one of the memory cell blocks is selected in the selected memory cell matrix by a block decoder circuit. In the selected memory cell block, one of the memory cells is accessed in accordance with the application of low level signal (0 V) by an X-decoder circuit, while non-accessed memory cells are applied with high level signal (5 V). As a result, if the accessed memory cell is the enhancement transistor, it is turned on even under the application of low level signal. On the other hand, the non-accessed memory cells are turned on regardless of the type of transistors. Thus, a potential of the digit line which is thereby connected through the turned-on memory cells including the accessed memory cell to ground is lowered, for instance, from 1.2 V to 1.1 V. This potential change is amplified in a sense amp circuit to provide information read from the accessed memory cell.

On the contrary, if the accessed memory cell is the depletion transistor, it is not turned on under the application of low level signal. Therefore, the potential change does not occur. In this manner, information stored in the memory cell unit is read upon the access of a predetermined one of the memory cells by applying a low level signal thereto, while a high level signal is applied to the non-accessed memory cells of the selected block, and to the remaining memory cells of the selected memory cell matrix and the non-selected memory cell matrices.

In this conventional mask programmable read only memory, however, there is a disadvantage in that electric field stress applied to the memory cells is large to shorten the life thereof, thereby lowering the reliability thereof, because a high level signal is applied to all word lines except for one word line which is selected at the access time by the X-decoder circuit. The same thing can be said at the stand-by time, because all the word lines are applied with a high level signal.

SUMMARY OF THE INVENTION

Accordingly, it is an object of the invention to provide a semiconductor memory device in which electric field stress applied to memory cells is relieved at the time of stand-by and active modes to enhance the reliability thereof.

According to the invention, a semiconductor memory device, comprises:

a memory cell unit comprising a plurality of memory cell groups, each of the memory cell groups comprising a plurality of memory cell blocks, each of the memory cell blocks comprising a predetermined number of serially connected memory cells which are connected to the predetermined number of word lines, respectively, and connected between a digit line and a fixed potential, the serially connected memory cells storing information according to first and second threshold voltages of the predetermined number of serially connected transistors, the first threshold voltage being higher than the second threshold voltage;

first means for selecting one memory cell group from the plurality of memory cell groups according to an address signal;

second means for selecting one memory cell block from the plurality of memory cell blocks in the one memory cell group according to the address signal; and third means for selecting one memory cell from the serially connected memory cells in the one memory cell block according to the address signal; wherein:

the third means applies a first voltage to the one memory cell and a second voltage to the serially connected memory cells excluding the one memory cell in the one memory cell block, the first voltage being lower than the first threshold voltage and higher than the second threshold voltage, and the second voltage being higher than the first threshold voltage, and the third means applies the second voltage to memory cells in the plurality of memory cell blocks excluding the one memory cell block and in the plurality of memory cell groups excluding the one memory cell group.

BRIEF DESCRIPTION OF THE DRAWINGS

This invention will be explained in more detail in conjunction with appended drawings, wherein:

FIG. 5 to 7 are truth tables explaining operation in the conventional mask programmable read only memory in FIGS. 1 to 4;

FIG. 8 is a circuit diagram showing an X-decoder circuit in a mask programmable read only memory of a first preferred embodiment according to the invention;

FIGS. 9 to 11 are truth tables explaining operation in the mask programmable read only memory of the first preferred embodiment according to the invention.

DESCRIPTION OF PREFERRED EMBODIMENTS

Before explaining a mask programmable read only memory of preferred embodiments according to the invention, the aforementioned conventional mask programmable read only memory will be explained in more detail.

Figure 1:
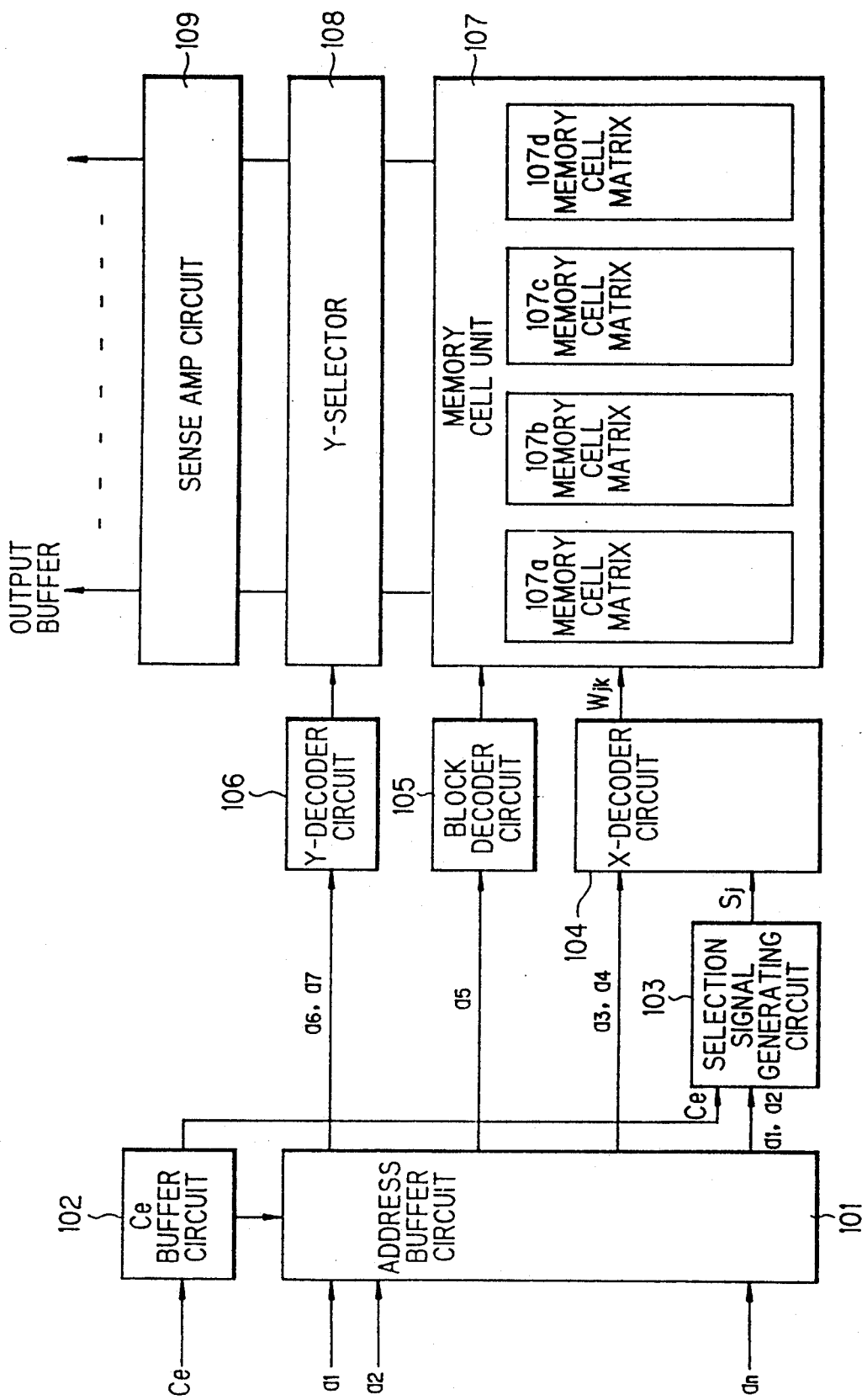
FIG. 1 is a block diagram showing a conventional mask programmable read only memory.

In FIG. 1, the conventional mask programmable read only memory comprises an address buffer circuit 101 for temporally storing an address signal of n bits ($a_1$, $a_2$, . . . $a_n$), assuming that n is 7 hereinafter, a chip enable signal buffer circuit 102 for temporally storing a chip enable signal Ce, a selection signal generating circuit 103 for generating a selection signal Sj, assuming that j is 1 to 4 hereinafter, by receiving the two bits $a_1$ and $a_2$ of the address signal and the chip enable signal Ce, an X-decoder circuit 104 for generating a word line signal Wjk, assuming that k is 1 to 4 hereinafter, by receiving the two bits $a_3$ and $a_4$ of the address signal and the selection signal Sj, a block decoder circuit 105 for selecting one memory cell block (to be explained in FIG. 2) by receiving the bit $a_5$ of the address signal, a Y-decoder circuit 106 for controlling the selection of one memory cell matrix (to be explained in FIG. 2) by receiving the two bits $a_6$ and $a_7$ of the address signal, a memory cell unit 107 having memory cell matrices 107a, 107b, 107c and 107d (to be explained in FIG. 2), a Y-selector 108 for selecting one of the memory cell matrices 107a, 107b, 107c and 107d, and a sense amp circuit 109 for amplifying a signal read from an accessed memory cell.

Figure 2:
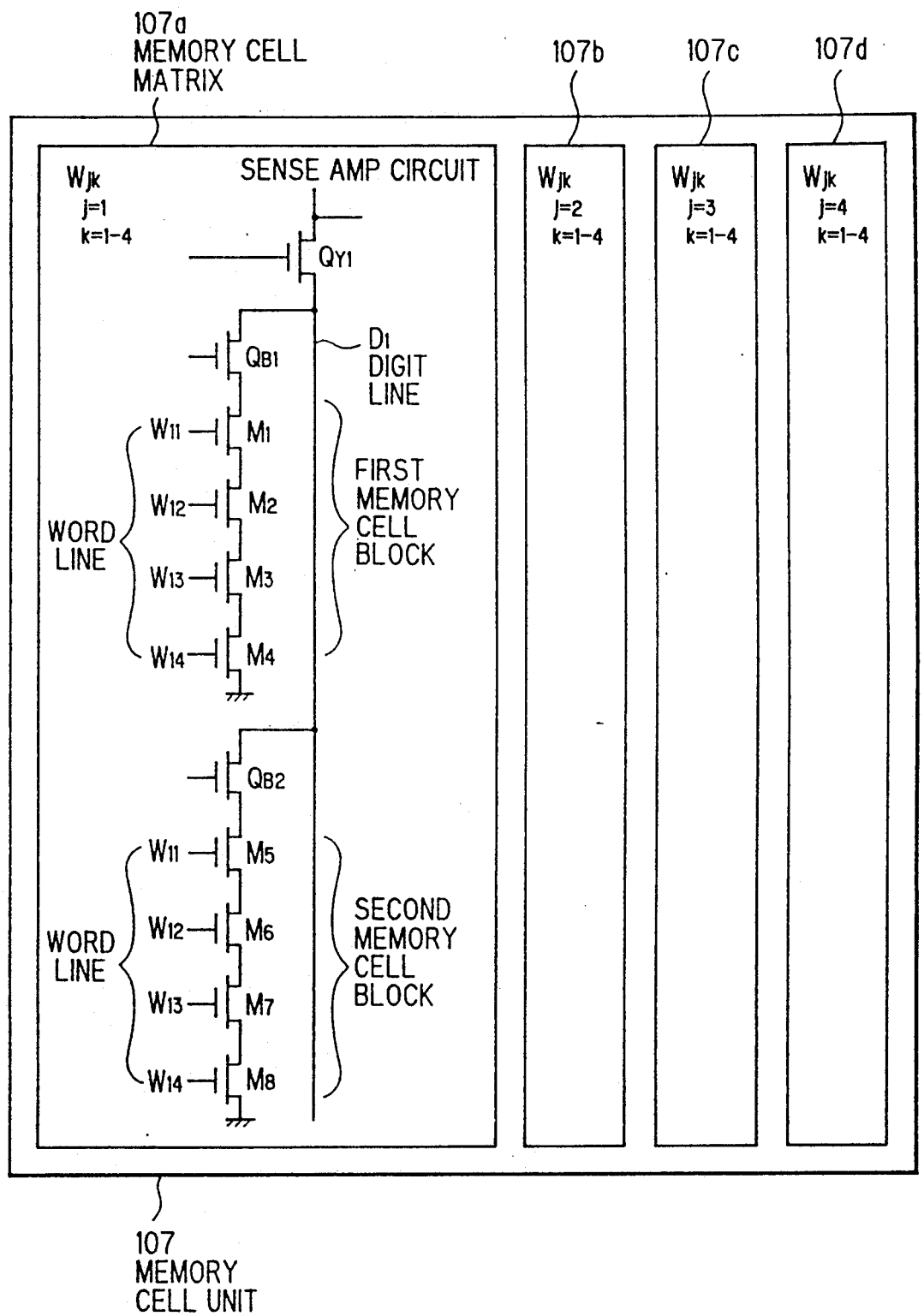
FIG. 2 is a circuit diagram showing one of memory cell matrices in the conventional mask programmable read only memory in FIG. 1.

In FIG. 2, the memory cell unit 107 comprises the memory cell matrices 107a, 107b, 107c and 107d, each of which comprises the two memory cell blocks as shown in the block of the memory cell matrix 107a. In a first one of the memory cell blocks, memory cells $M_1$, $M_2$, $M_3$ and $M_4$, each consisting of a transistor selected dependently on storing binary states from an N-MOS enhancement transistor having a threshold voltage of 1.0 V and an N-MOS depletion transistor having a threshold voltage of $-5.0$ V, are connected serially to be positioned between ground and a block selection transistor $Q_{B1}$ of an N-MOS enhancement transistor having a threshold voltage of 1.0 V. The block selection transistor $Q_{B1}$ is connected commonly to a digit line $D_1$ and to a Y-selection transistor $Q_{Y1}$ of an N-MOS enhancement transistor having a threshold voltage of 1.0 V. The memory cells $M_1$, $M_2$, $M_3$ and $M_4$ are connected at gates to the word lines $W_{11}$, $W_{12}$, $W_{13}$ and $W_{14}$ each connected to the X-decoder circuit 104, and the block and Y-selection transistors $Q_{B1}$ and $Q_{Y1}$ are connected at gates to the block and Y-decoder circuits 105 and 106, correspondingly. In a second one of the memory cell blocks, serially connected memory cells $M_5$, $M_6$, $M_7$ and $M_8$ are positioned between a block selection transistor $Q_{B2}$ connected to the digit line $D_1$ and ground and controlled by block decoder 105, wherein type and threshold voltage of the transistors are the same as those of the first one of the memory cell blocks.

Figure 3:
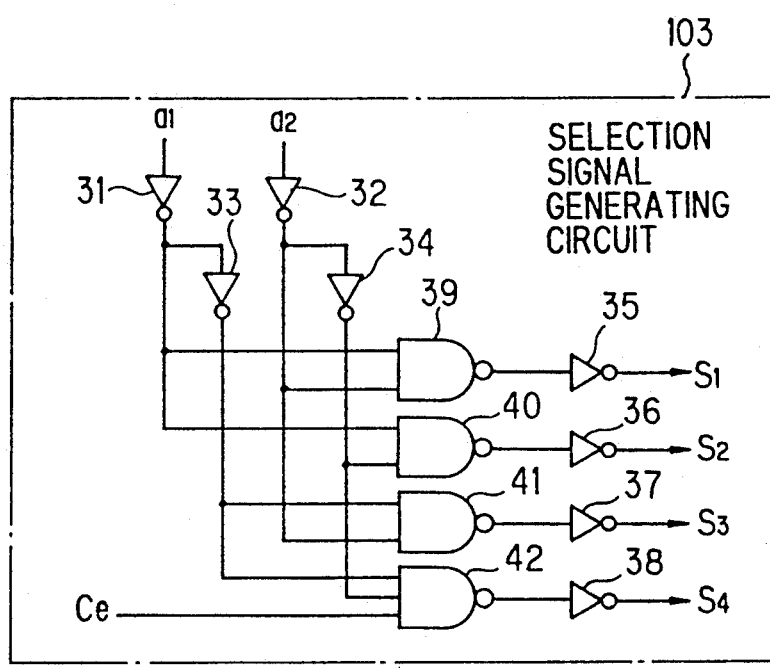
FIG. 3 is a circuit diagram showing a selection signal generating circuit in the conventional mask programmable read only memory in FIG. 1.

In FIG. 3, the selection signal generating circuit 103 comprises inverters 31 and 32 for inverting the two bits $a_1$ and $a_2$ of the address signal, inverters 33 and 34 for inverting output signals of the inverters 31 and 32, NAND circuits 39 to 42, respectively, for receiving the output signals of the inverters 31 and 32, the output signal of the inverter 31 and an output signal of the inverter 34, an output signal of the inverter 33 and the output signal of the inverter 32, and the chip enable signal Ce and the output signals of the inverters 33 and 34, inverters 35 to 38, respectively, connected to the NAND circuits 39 to 42 to provide the selection signals $S_1$ to $S_4$ which are supplied to the X-decoder circuit 104.

Figure 4:
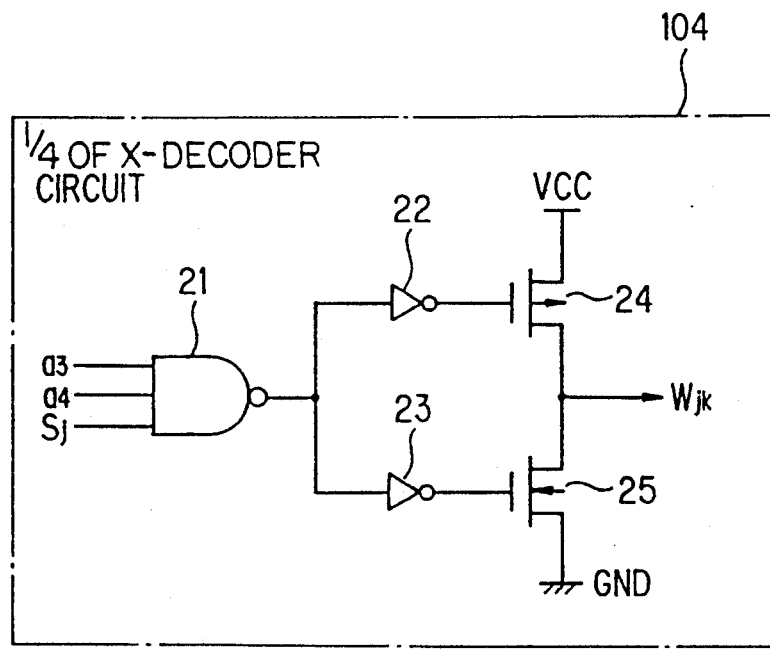
FIG. 4 is a circuit diagram showing an X-decoder circuit in the conventional mask programmable read only memory in FIG. 1.

In FIG. 4, one-fourth of the X-decoder circuit 104 comprises a NAND circuit 21 for receiving the two bits $a_3$ and $a_4$ of the address signal and the selection signal Sj, and inverters 22 and 23 for receiving an output signal of the NAND circuits 21 and supplying output signals, respectively, to a P-MOS transistor 24 connected to a power supply Vcc and an N-MOS transistor 25 connected to ground, wherein the word line signal Wjk is supplied from a common node of source to drain path of the P- and N-MOS transistors 24 and 25. It will be apparent to those skilled in the art how to construct the other address combinations of the X-decoder circuit as shown in FIG. 6.

In operation, the address signal $a_1$, $a_2$, . . . $a_7$ having the two bits $a_1$ and $a_2$ of a high level is supplied to the address buffer circuit 101, and the chip enable signal Ce of a low level is supplied to the chip enable buffer circuit 102, so that the selection signal Sj of a low level is generated in the selection signal generating circuit 103 to be supplied to the X-decoder circuit 104, in which the word line signal Wjk of a high level is generated to be supplied to all of the memory cells in the memory cell matrices 107a, 107b, 107c and 107d of the memory cell unit 107 regardless of the address signal bits $a_3$ and $a_4$. As a result, the stand-by mode is set, as shown in FIG. 5.

When the chip enable signal Ce becomes high, one of the selection signals $S_1$, $S_2$, $S_3$ and $S_4$ becomes high in the selection signal generating circuit 103 dependently on contents of the address signal bits $a_1$ and $a_2$, as shown in FIG. 7. Assuming that the selection signal $S_1$ is high due to the two bits $a_1$ and $a_2$ of a low level, while the selection signals $S_2$ to $S_4$ are low, the word line signals $W_{11}$, $W_{12}$, $W_{13}$ and $W_{14}$ are determined in the X-decoder circuit 104 by contents of the two bits $a_3$ and $a_4$ supplied to the NAND circuit 21 along with the selection signal $S_1$, as shown in FIG. 6. Assuming that the two bits $a_3$ and $a_4$ are high, the word line signal $W_{11}$ is low, because the N-MOS transistor 25 is turned on, while the P-MOS transistor 24 is turned off. On the other hand, the word line signals $W_{12}$, $W_{13}$ and $W_{14}$ are high, as shown in FIG. 7. At this time, the address signal bit $a_5$ of a high level is decoded in the block decoder circuit 105, so that the block selection transistor $O_{B1}$ is turned on to select the first one of the memory cell blocks in the memory cell matrix 107a which is selected in accordance with the turning-on of the Y-selection transistor $Q_{Y1}$ by the address signal bits $a_6$ and $a_7$ supplied to the Y-decoder circuit 106. As a result, the memory cell $M_1$ of the first one of the memory cell blocks in the memory cell matrix 107a is applied with a low level signal, while all of the remaining memory cells of the memory cell matrix 107a and the memory cells of the memory cell matrices 107b, 107c and 107d are applied with a high level, as shown in FIG. 7. If the accessed memory cell $M_1$ is an N-MOS enhancement transistor, it is not turned on, so that the digit line $D_1$ is not changed regarding a potential (for instance, 1.2 V to be maintained).

On the contrary, if the accessed memory cell $M_1$ is an N-MOS depletion transistor, it is turned on, so that the digit line $D_1$ is changed regarding the potential (for instance, lowering from 1.2 V to 1.1 V). This change is transmitted to the sense amp circuit 109, in which it is amplified to be supplied to an output buffer circuit (not shown). Thus, information stored in the memory cell $M_1$ is read Next, a mask programmable read only memory of the first preferred embodiment according to the invention will be explained.

Figures 8, 9, 10:
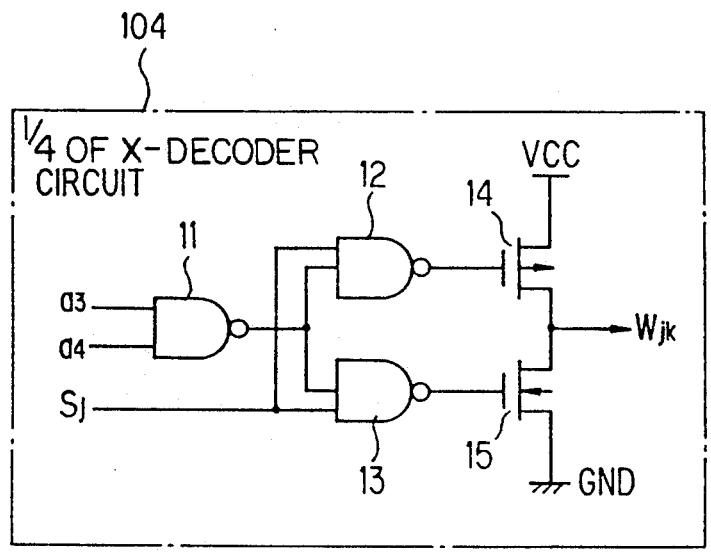

In FIG. 8, one-fourth of an X-decoder circuit included in the mask programmable read only memory of the first preferred embodiment is shown, while other circuits are not shown, because the same circuits as used in the conventional mask programmable read only memory as shown in FIGS. 1 to 3 are adopted in the first preferred embodiment. It will be apparent to those skilled in the art how to construct the other address combinations of the X-decoder circuit as shown in FIG. 10.

The X-decoder circuit 104 comprises a first NAND circuit 11 for receiving two bits $a_3$ and $a_4$ of an address signal of, for instance, seven bits $a_1, a_2, \ldots a_7$ and generating a first NAND signal, a second NAND circuit 12 for receiving a selection signal Sj from a selection signal generating circuit (FIG. 1) and the first NAND signal from the first NAND circuit 11 and generating a second NAND signal, a third NAND circuit 13 for receiving the selection signal Sj from the selection signal generating circuit and the first NAND signal from the first NAND circuit 11 and generating a third NAND signal, a P-MOS transistor 14 for generating a word line signal Wjk of a high level in accordance with the turning-on by receiving the second NAND signal, and an N-MOS transistor 15 for generating the word line signal Wjk of a low level in accordance with the turning-on by receiving the third NAND signal.

In operation, the selection signals $S_1$ to $S_4$ are all low at the time of stand-by mode, as shown in FIG. 9. When any of the selection signals $S_1$ to $S_4$ of a low level is supplied to the second NAND circuit 13 of the X-decoder circuit 104, the word line signal Wjk is low, as shown in FIG. 9, because the P-MOS transistor 14 is turned off, while the N-MOS transistor 15 is turned on, regardless of contents of the address signal bits $a_3$ and $a_4$ supplied to the first NAND circuit 11.

Next, when the chip enable signal Ce becomes high, the active mode is set to read information from an accessed memory cell of the memory cell unit.

Here, it is assumed that a memory cell $M_1$ will be accessed. For the purpose, the two bits $a_1$ and $a_2$ of the address signal are low, so that the selection signal $S_1$ becomes high in the selection signal generating circuit, while the selection signals $S_2$ to $S_4$ becomes low, as shown in FIG. 11. As a result, the memory cell matrix 107a (FIG. 2) including the memory cell $M_1$ is selected, and the memory cell matrices 107b, 107c and 107d are not selected.

In the X-decoder circuit 104, the address signal bits $a_3$ and $a_4$ of a high level are supplied to the first NAND circuit 11, as shown in FIG. 10, so that the first NAND signal of a low level is supplied to the second and third NAND circuits 12 and 13. At the same time, the selection signal $S_1$ of a high level is supplied to the third NAND circuit 13, so that the P-MOS transistor 14 is not turned on, while the N-MOS transistor 15 is turned on to provide the word line signal $W_{11}$ of a high level for the memory cell $M_1$. On the other hand, the word line signals $W_{12}$, $W_{13}$ and $W_{14}$ are high, because the selection signal supplied from second NAND circuits 12 of respective X-decoder circuits 104 is low.

Otherwise, all word line signals are low in the memory cell matrices 107b, 107c and 107d of the memory cell unit 107 which are not selected in accordance with the selection signals $S_2$ to $S_4$ of a low level, regardless of contents of the bits $a_3$ and $a_4$, as shown in FIG. 11.

As clearly understood from the first preferred embodiment, all of the word lines are set to be low at the time of stand-by mode, and the word lines connected to the memory cells of the memory cell matrices which are not selected are all set to be low at the time of active mode. Consequently, electric field stress applied to memory cells is relieved to enhance the reliability of the mask programmable read only memory.

Figure 12:
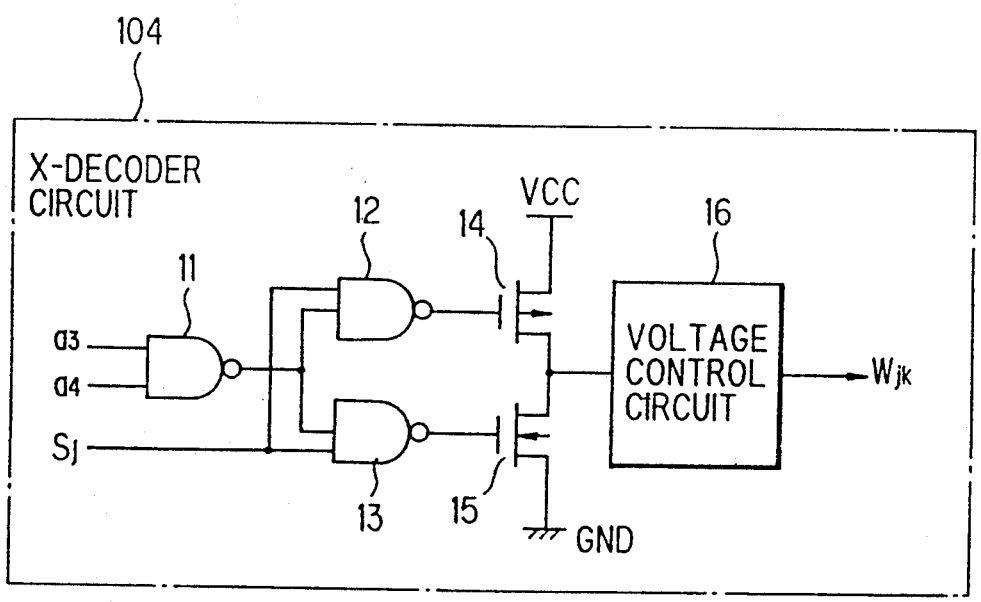
FIG. 12 is a circuit diagram showing an X-decoder circuit in a mask programmable read only memory of a second preferred embodiment according to the invention.

In FIG. 12, an X-decoder circuit included in a mask programmable read only memory of the second preferred embodiment according to the invention is shown, wherein like parts are indicated by like reference numerals as used in FIG. 8.

Even in the second preferred embodiment, other circuits than the X-decoder circuit are the same as those in the conventional mask programmable read only memory.

The X-decoder circuit comprises a voltage control circuit 16 connected to a common node of source to drain path of the P- and N-MOS transistors 14 and 15 to supply a word line signal Wjk to word lines connected to memory cells, in addition to the structure as shown in FIG. 8.

In operation, when the word line signal $W_{12}$, $W_{13}$ and $W_{14}$ of a high level which are indicated as "j=1" in FIG. 11 are controlled to be a voltage less than a power supply voltage Vcc and more than a threshold voltage of the N-channel MOS enhancement transistor by the voltage control circuit 15, so that electric field stress is more relieved in the second preferred embodiment than the first preferred embodiment.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor memory device comprising:
   a memory cell unit comprising a plurality of memory cell groups, each of said memory cell groups comprising a plurality of memory cell blocks, each of said memory cell blocks comprising a predetermined number of memory cells which are respectively connected to a predetermined number of word lines and serially connected between a digit line and a fixed potential, each of said predetermined number of memory cells including a transistor for storing information according to first and second threshold voltages, said first threshold voltage being higher than said second threshold voltage;
   first means for selecting one memory cell group from said plurality of memory cell groups according to an address signal;
   second means for selecting one memory cell block from said plurality of memory cell blocks in said one memory cell group according to said address signal; and third means for selecting one memory cell from said predetermined number of memory cells in said one memory cell block according to said address signal wherein, in an active mode, said third means applies a first voltage to said one memory cell and a second voltage to said predetermined number of memory cells excluding said one memory cell in said one memory cell block, said first voltage being lower than said first threshold voltage and higher than said second threshold voltage and said second voltage being higher than said first threshold voltage, and said third means applies said first voltage to memory cells in said plurality of memory cell blocks excluding said one memory cell block and in said plurality of memory cell groups excluding said one memory cell group, and, in a standby mode, said third means applies the first voltage to all of said memory cells.

2. A semiconductor memory device according to claim 1 wherein said third means includes a plurality of serially connected first and second transistors respectively coupled to said word lines and alternately turned on and off according to said address signal and a chip enable signal, said first and second transistors being respectively coupled to said first and second voltages.

3. A semiconductor memory device according to claim 1 wherein said third means includes a voltage control circuit respectively coupled between the first and second transistors and said word lines for controlling said second voltage to be lower than a power supply voltage to a predetermined extent.

4. A semiconductor memory device comprising:

a plurality of memory cell blocks, each memory cell block including a plurality of memory cell transistors serially coupled between a digit line and a fixed potential, each memory cell transistor having a control input and storing information according to first and second voltage thresholds;

a memory cell block selecting means coupled to the digit line for selecting one of the plurality of memory cell blocks; and an address decoding circuit responsive to a plurality of address signals and a chip enable signal and having a plurality outputs respectively coupled to the control input of the memory cell transistors for decoding the plurality of address signals including:

a standby mode, responsive to the chip enable signal being inactive, for maintaining all of the control inputs at a first voltage potential, and an active mode, responsive to the chip enable signal being active, for maintaining the control input of one memory cell transistor from one memory cell block at the first voltage potential, maintaining the control input of the other memory cell transistors from the one memory cell block at a second voltage potential and maintaining the control input of the memory cell transistors from the other memory cell blocks excluding the one memory cell block at the first voltage potential, the second voltage potential being higher than the first voltage potential.

5. The semiconductor memory device of claim 4 wherein the plurality of address signals include first and second address signals and wherein each memory cell block includes first to fourth memory cell transistors and a block selection transistor, the first to fourth memory cell transistors and the block selection transistor being serially connected between the digit line and the fixed potential, wherein in the active mode:

when the first and second address signals are inactive, the control input of the first memory cell transistor is at the first voltage potential and the control inputs of the second to fourth memory cell transistors are at the second voltage level, when the first address signal is active and the second address signal is inactive, the control input of the second memory cell transistor is at the first voltage potential and the control inputs of the first, third, and fourth memory cell transistors are at the second voltage level, when the first address signal is inactive and the second address signal is active, the control input of the third memory cell transistor is at the first voltage potential and the control inputs of the first, second, and fourth memory cell transistors are at the second voltage level, and when the first address signal is active and the second address signal is active, the control input of the fourth memory cell transistor is at the first voltage potential and the control inputs of the first to third memory cell transistors are at the second voltage level.

6. The semiconductor memory device of claim 4 wherein the address decoding circuit includes a voltage control circuit connected to the control inputs of the plurality of memory cell transistors for controlling the second voltage to be lower than a power supply voltage and higher than a threshold voltage of an N-channel MOS enhancement transistor for reducing electric field stress.

* * * * *